(12) United States Patent
Gilliland et al.

(10) Patent No.: US 7,442,882 B2
(45) Date of Patent: Oct. 28, 2008

(54) 3D CHECKERBOARD PERFORATION PATTERN FOR INCREASED SHIELDING EFFECTIVENESS

(75) Inventors: Don A. Gilliland, Rochester, MN (US); Charles C. Stratton, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 14 days.

(21) Appl. No.: 11/430,650

(22) Filed: May 8, 2006

(65) Prior Publication Data

US 2007/0272438 A1  Nov. 29, 2007

(51) Int. Cl.
*H05K 9/00* (2006.01)
*H02B 1/56* (2006.01)

(52) U.S. Cl. .................. 174/383; 361/816; 361/718; 165/172

(58) Field of Classification Search .................. 174/377, 174/383; 361/816, 818, 718; 165/80.3, 172
See application file for complete search history.

(56) References Cited

U.S. PATENT DOCUMENTS

| 5,701,951 | A  | * | 12/1997 | Jean   | 165/121  |
|-----------|----|---|---------|--------|----------|
| 6,460,608 | B1 | * | 10/2002 | Katsui | 165/80.3 |
| 2003/0136545 | A1 | * | 7/2003  | Lin et al. | 165/80.3 |
| 2004/0010912 | A1 | * | 1/2004  | Jean   | 29/890.03 |
| 2004/0105235 | A1 | * | 6/2004  | Lai    | 361/700  |
| 2006/0215372 | A1 | * | 9/2006  | Jeong  | 361/719  |

\* cited by examiner

*Primary Examiner*—Hung V Ngo
(74) *Attorney, Agent, or Firm*—Dillon & Yudell LLP

(57) ABSTRACT

An improved electromagnetic radiation (EMR) shield that has minimal airflow resistance is presented. The EMR shield includes: a base plate; and plurality of columns that project away from the base plate, wherein each of the columns has a first end that is attached to the base plate, a second end that is distal to the base plate, and a side surface that has at least one side hole therein.

18 Claims, 6 Drawing Sheets

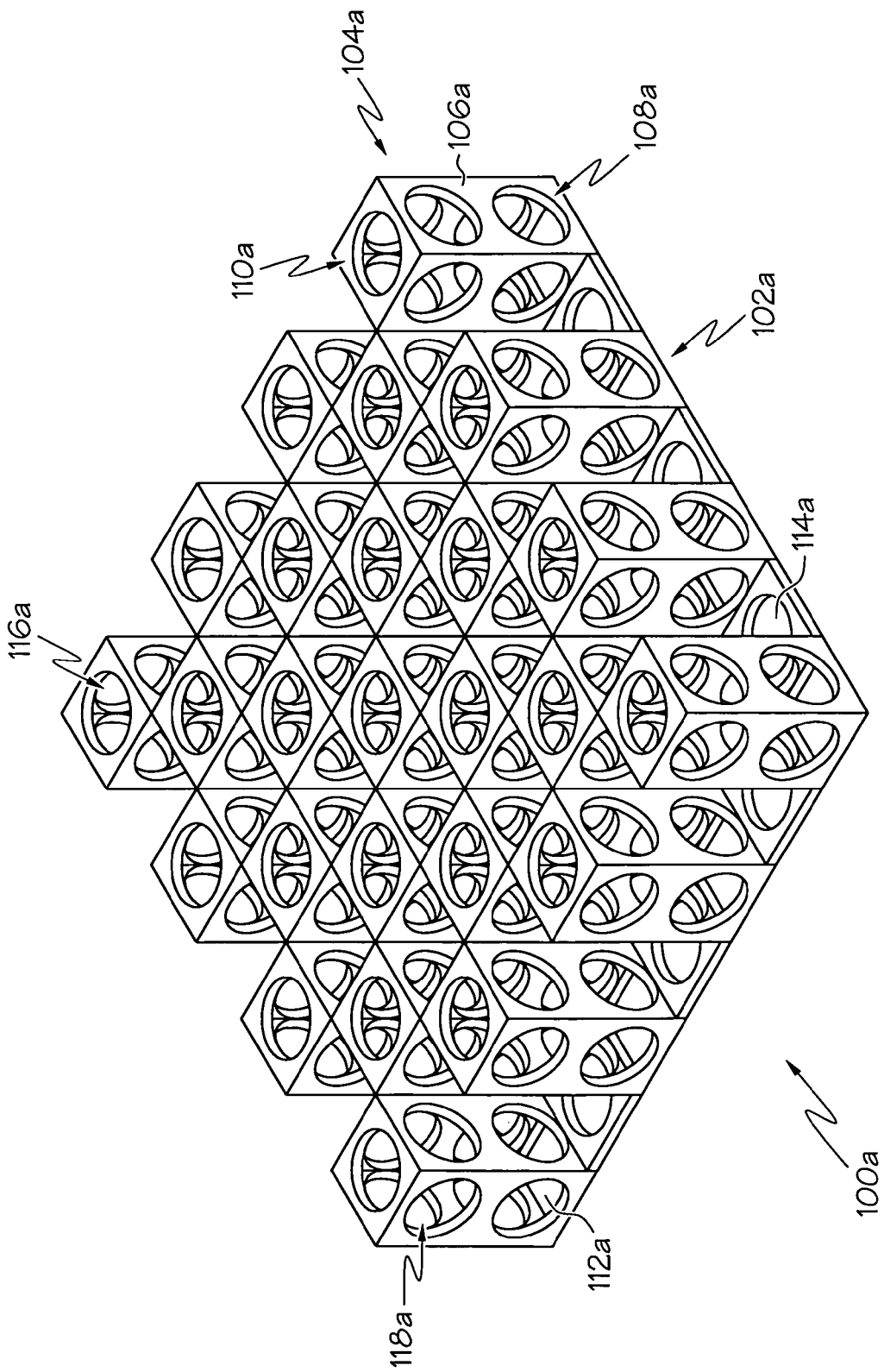

3D CHECKERBOARD PERFORATION PATTERN FOR INCREASED SHIELDING EFFECTIVENESS

BACKGROUND OF THE INVENTION

1. Technical Field

The present invention relates in general to the field of computers and similar technologies, and in particular to hardware that is in need of effective electromagnetic shielding. Still more particularly, the present invention relates an electromagnetic shield that causes only minimal obstruction to cooling airflow to an electronic device.

2. Description of the Related Art

A typical modern electronic device, such as a computer, has two conflicting problems. The first is heat, and the second is electromagnetic radiation noise. Regarding the first problem, many electronic devices generate high levels of heat, which must be removed. This heat removal is typically accomplished by air flow that conducts heat away from the device. Optimal airflow is achieved with minimal (or no) obstruction of the airflow carrying heat away from the electronic device. Thus an ideal configuration for removing heat would be a completely open area around the heat generating electronic device. However, this would exacerbate the problem of electromagnetic radiation (EMR) noise. Regarding the EMR noise problem, many electronic devices either generate EMR noise, and/or are adversely impacted by EMR noise from other nearby devices. To minimize this problem, an EMR shield (often referred to as a radiofrequency shield or simply an "RF shield") is placed around the electronic device. An optimal EMR shield allows no EMR radiation to pass through the shield. However, prior art EMR shields (such as copper screens, etc.) often obstruct airflow, which exacerbates the first problem (heat). For example, screens often become clogged up with dust, lint, etc., thus exacerbating the airflow blockage problem. What is needed, therefore, is an EMR shield that facilitates unobstructed airflow away from a heat generating electronic device.

SUMMARY OF THE INVENTION

To address the need described above for an improved electromagnetic radiation (EMR) shield that has minimal airflow resistance, the present invention includes, but is not limited to, an electromagnetic shield that includes: a base plate; and plurality of columns that project away from the base plate, wherein each of the columns has a first end that is attached to the base plate, a second end that is distal to the base plate, and a side surface that has at least one side hole therein.

The above, as well as additional purposes, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further purposes and advantages thereof, will best be understood by reference to the following detailed description of an illustrative embodiment when read in conjunction with the accompanying drawings, where:

FIGS. 1a-d illustrates various configurations of an electromagnetic radiation (EMR) shield having columns that afford EMR shielding with only minimal airflow blockage;

DETAILED DESCRIPTION OF THE PREFERRED EMBODIMENT

Figure 1B:
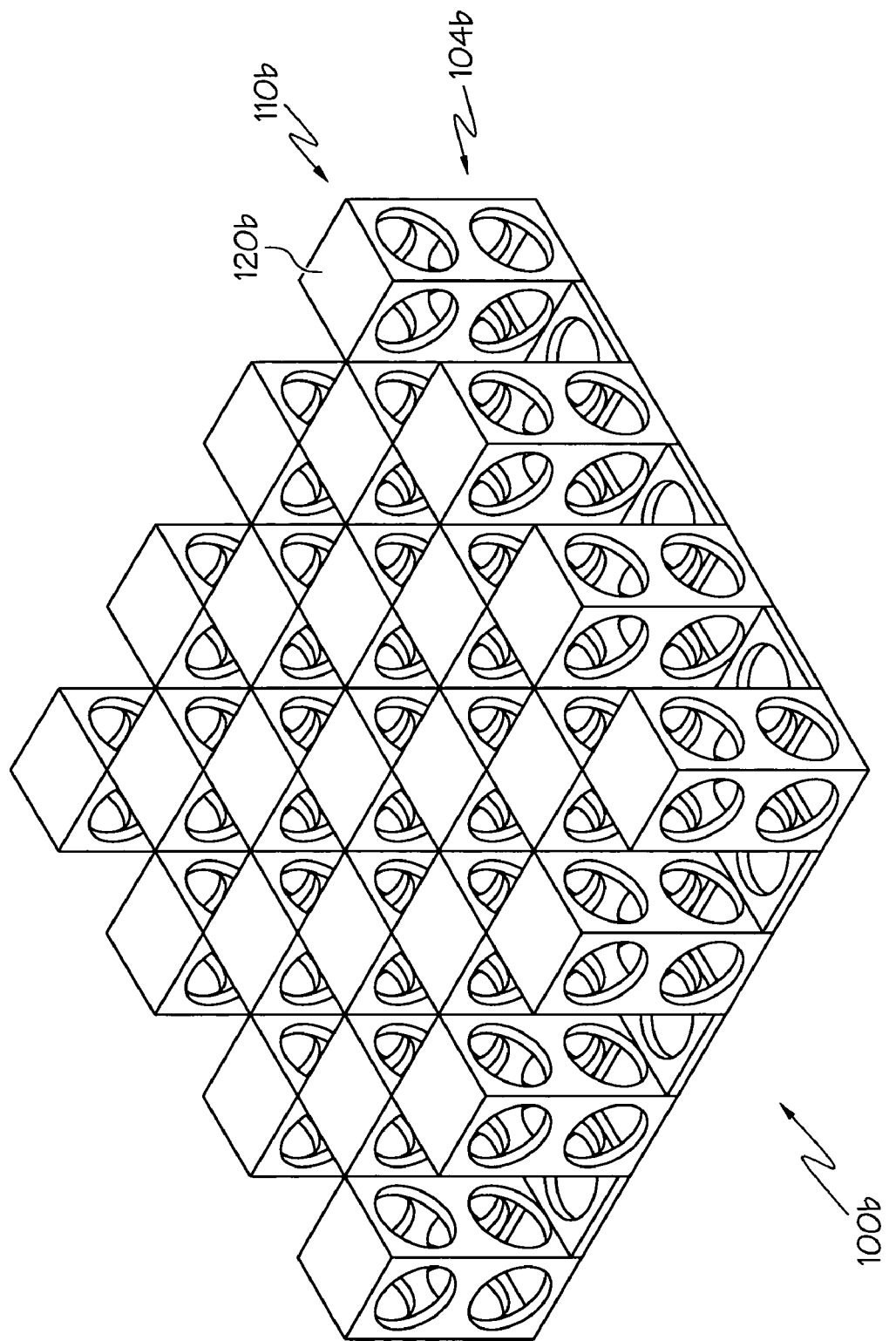

One embodiment of the invention includes a novel checkerboard pattern of holes in an electromagnetic shield. The holes are shaped in alternating depths to increase the effective depth of a perforation pattern. Using this pattern, the hole size may be increased, thus allowing a higher percentage open pattern to promote unimpeded air flow through the electromagnetic shield.

With reference now to the figures, and in particular to FIG. 1a, an electromagnetic radiation (EMR) shield 100a is depicted. EMR shield 100a has a base plate 102a, and a plurality of columns 104a. Each of the columns 104a has multiple sides 106a. As depicted in FIG. 1a, each column 104a has a transverse square cross section, which provides an optimal shape for ease in construction as well as optimal waveguide characteristics. Alternatively, columns 104a may have other cross sections, including circles (to create a cylindrical shape), triangles (to create a three-sided prism), etc. Each column 104a also has a first end 108a that is proximate to base plate 102a, and a second end 110a that is distal from base plate 102a. As shown in FIG. 1a, first end 108a may have a base plate column hole 112a that goes through base plate 102a. In addition, base plate 102a may have a base plate holes 114a oriented between at least two of the first ends 108a. Note also that in EMR shield 100a, a top hole 116a is found in each second end 110a. Because of the airflow that passes through top holes 116a and side holes 118a, EMR shield 100a provides maximum airflow through EMR shield 100a, while still providing excellent EMR shielding. While side holes 118a are depicted as being circular and or of uniform size, they may alternatively be different sizes (larger or smaller, either uniformly or non-uniformly such that each hole 118 is either the same size or a different size than some or all of the other holes 118). Furthermore, the shape of the size holes 118a may be different shape (uniformly or non-uniformly shaped as squares, ovals, triangles, etc.)

Referring now to FIG. 1b, an EMR shield 100b is presented. Note that each second end 110b has a solid top 120b. This afford additional EMR shielding, while still allowing relatively unobstructed airflow through side holes 118b and base plate holes 114b.

Figure 1C:
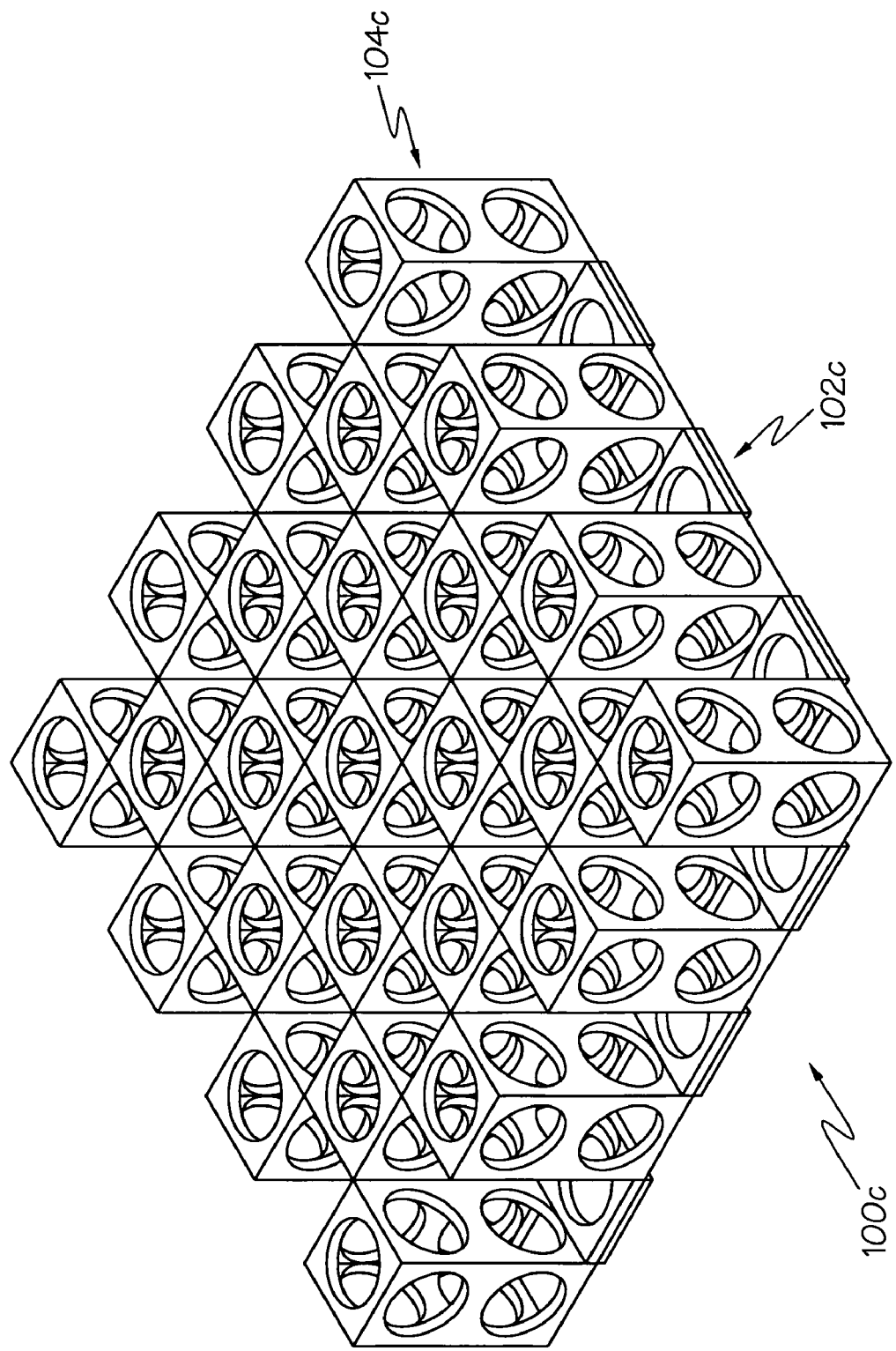

With reference now to FIG. 1c, an EMR shield 100c is presented. EMR shield 100c is similar to EMR shield 100a shown in FIG. 1a, except that there are no base plate holes 114, in base plate 102c, between the bases of the columns 104c. This configuration provides additional EMR shielding, but with a slight degradation in airflow through EMR shield 100c.

Figure 1D:
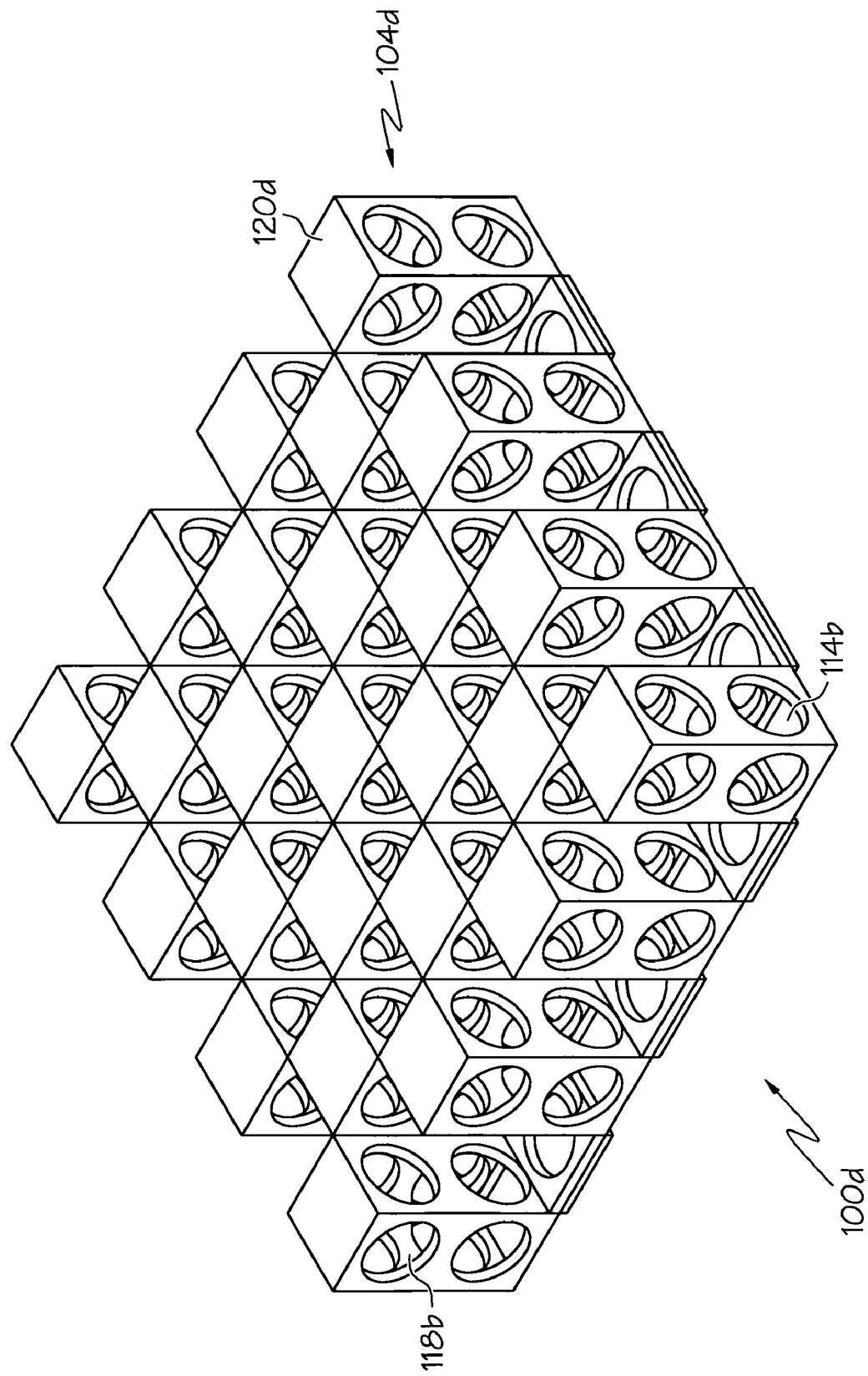

Finally, FIG. 1d shows an EMR shield 100d that has both solid tops 120d in columns 104d. EMR shield 100d also has an absence of base plate holes 114. This configuration provides even more EMR shielding, but with even less airflow.

Figure 2:
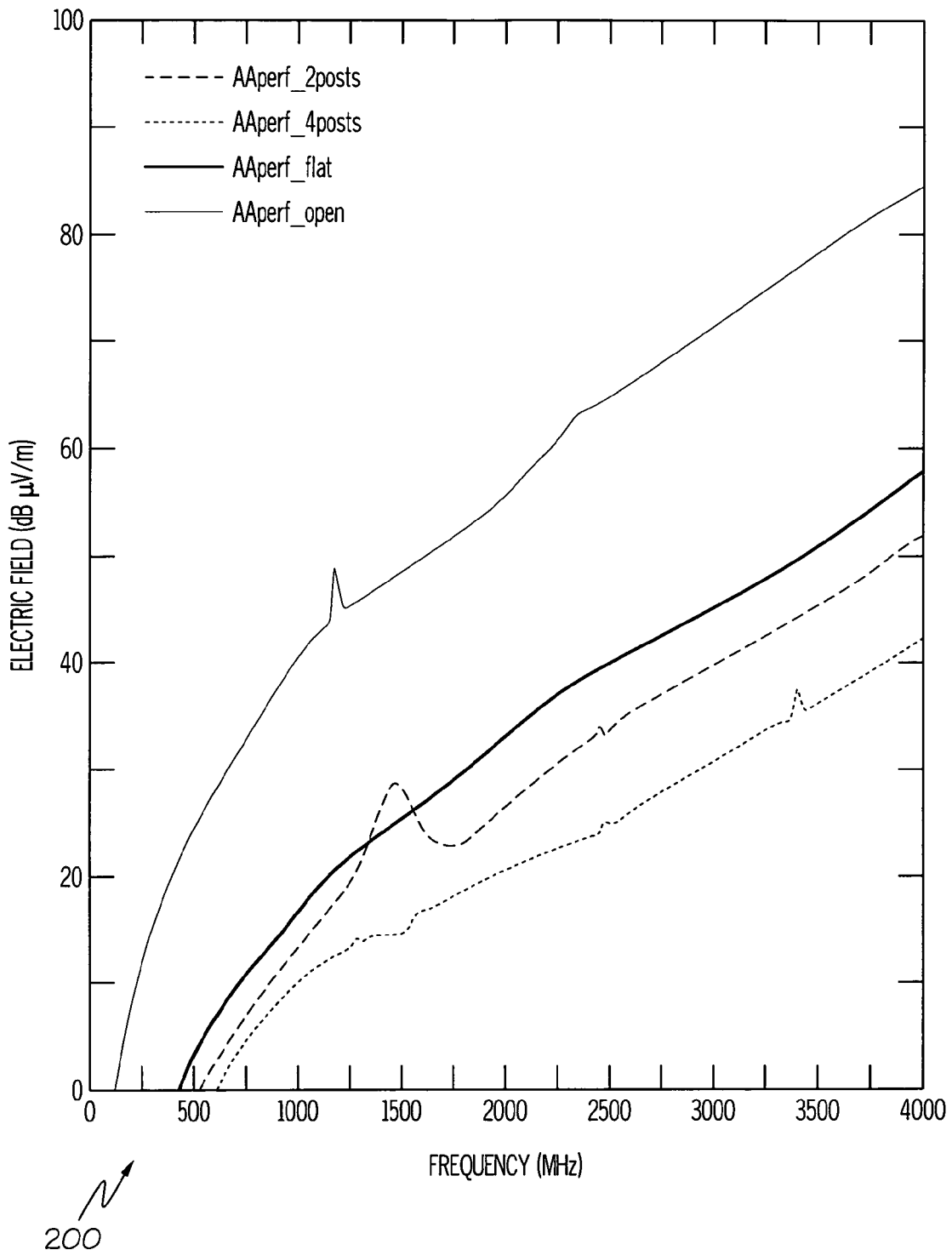
FIG. 2 depicts a graph showing the relative effectiveness, of various configurations of EMR shields, in attenuating EMR noise.

Referring now to FIG. 2, a graph 200 shows exemplary results for a small number of "columns" or blocks of increased depth from the source of emissions using EMR shield 100a shown in FIG. 1a. Graph 200 shows the relative EMR shielding performance of having no EMR shield at all (AAperf_open), normal flat perforations in the base plate but without any columns (AAperf_flat), a base plate that has two columns (AAperf_2posts), and a base plate that has four columns (AAperf_4posts). As shown in graph 200, a resonance occurs in the two columns performance data. The shielding effectiveness when using multiple columns is described in the formula: Shielding Effect $(SE_{dB})=(20 \log (\lambda/2*L))+(30*t/L)-10 \log n$, where lambda is the wavelength of the electromagnetic radiation, L is the hole diameter, t is the thickness of the material and n is the number of holes (in the base plate) that face the heat source. Thus, the effective depth t is increased by increasing the column height. Furthermore, columns on the source and receive side formed from conductive material act as waveguides with cut-off frequencies that tend to have better response than just two plated with holes in parallel. Note that the results of using an EMR 100b, c or d, which are depicted in corresponding FIGS. 1b-d, will result in additional EMR shielding, due to the direct plane reflections caused by solid tops 120, filled in holes in the base plate 102, etc.

Figure 3:
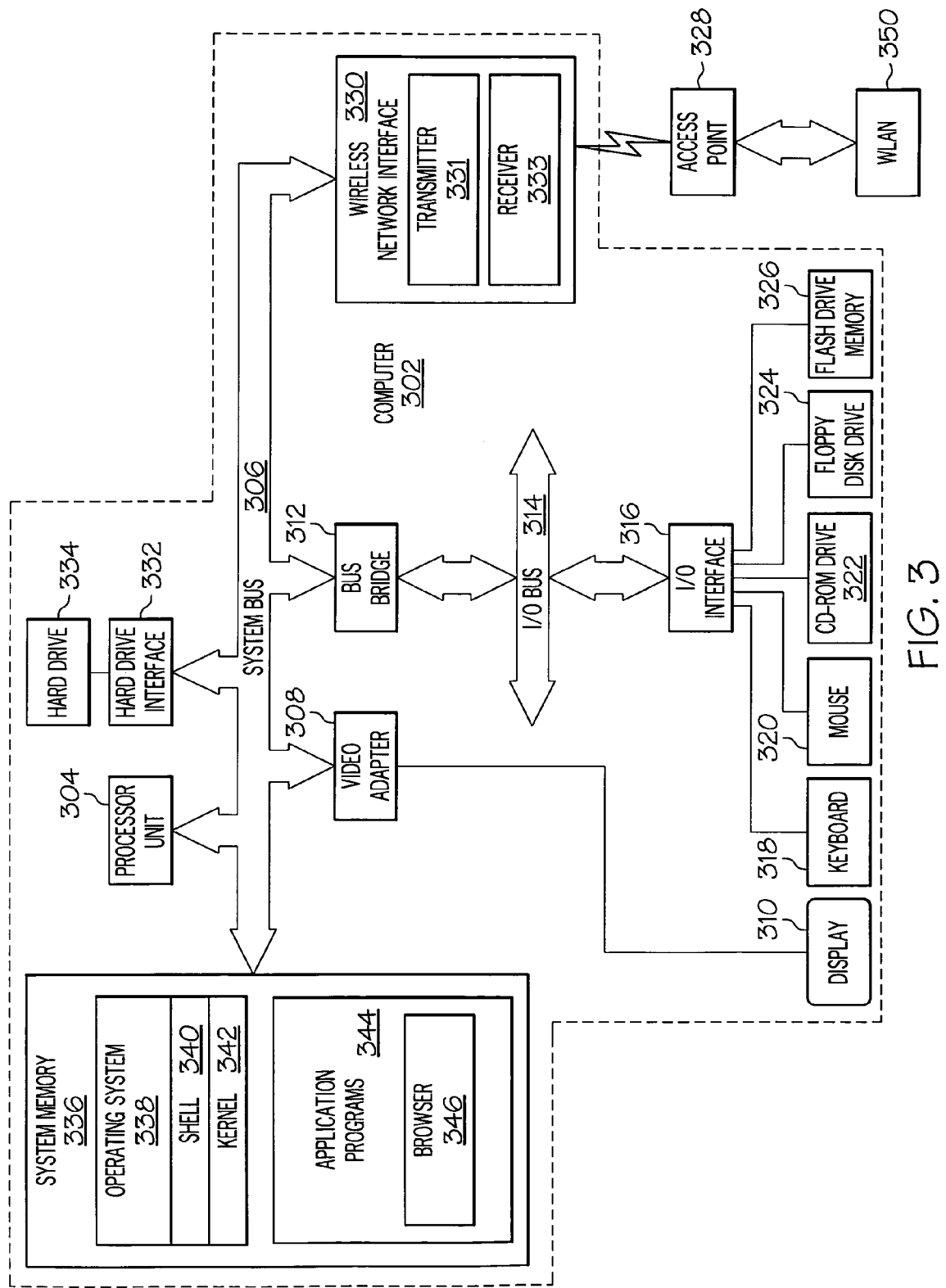
FIG. 3 depicts an exemplary computer in which the present invention may be implemented.

With reference now to FIG. 3, there is depicted a block diagram of an exemplary computer 302, in which the presently described EMR shield 100 may be utilized to provide EMR shielding while promoting efficient cooling air flow. That is, EMR shield 100 may be utilized with any heat generating component described below for computer 302, including but not limited to processing unit 304, system memory 336, et al. Computer 302 includes a processor unit 304 that is coupled to a system bus 306. A video adapter 308, which drives/supports a display 310, is also coupled to system bus 306. System bus 306 is coupled via a bus bridge 312 to an Input/Output (I/O) bus 314. An I/O interface 316 is coupled to I/O bus 314. I/O interface 316 affords communication with various I/O devices, including a keyboard 318, a mouse 320, a Compact Disk-Read Only Memory (CD-ROM) drive 322, a floppy disk drive 324, and a flash drive memory 326. The format of the ports connected to I/O interface 316 may be any known to those skilled in the art of computer architecture, including but not limited to Universal Serial Bus (USB) ports.

Computer 302 is able to wirelessly communicate with a Wireless Local Area Network (WLAN) 350 via an access point 328 using a wireless network interface 330, which is coupled to system bus 306. WLAN 350 may be connected to an external network such as the Internet, or an internal network such as an Ethernet or a Virtual Private Network (VPN). Note that wireless network interface 330 includes a transmitter 331 for transmitting data packets to access point 328, and a receiver 333 for receiving data packets from access point 328.

A hard drive interface 332 is also coupled to system bus 306. Hard drive interface 332 interfaces with a hard drive 334. In a preferred embodiment, hard drive 334 populates a system memory 336, which is also coupled to system bus 306. Data that populates system memory 336 includes computer 302's operating system (OS) 338 and application programs 344.

OS 338 includes a shell 340, for providing transparent user access to resources such as application programs 344. Generally, shell 340 is a program that provides an interpreter and an interface between the user and the operating system. More specifically, shell 340 executes commands that are entered into a command line user interface or from a file. Thus, shell 340 (as it is called in UNIX®), also called a command processor in Windows®, is generally the highest level of the operating system software hierarchy and serves as a command interpreter. The shell provides a system prompt, interprets commands entered by keyboard, mouse, or other user input media, and sends the interpreted command(s) to the appropriate lower levels of the operating system (e.g., a kernel 342) for processing. Note that while shell 340 is a text-based, line-oriented user interface, the present invention will equally well support other user interface modes, such as graphical, voice, gestural, etc.

As depicted, OS 338 also includes kernel 342, which includes lower levels of functionality for OS 338, including providing essential services required by other parts of OS 338 and application programs 344, including memory management, process and task management, disk management, and mouse and keyboard management.

Application programs 344 include a browser 346. Browser 346 includes program modules and instructions enabling a World Wide Web (WWW) client (i.e., computer 302) to send and receive network messages to the Internet using Hyper-Text Transfer Protocol (HTTP) messaging, thus enabling communication with the Internet.

The hardware elements depicted in computer 302 are not intended to be exhaustive, but rather are representative to highlight essential components required by the present invention. For instance, computer 302 may include alternate memory storage devices such as magnetic cassettes, Digital Versatile Disks (DVDs), Bernoulli cartridges, and the like. These and other variations are intended to be within the spirit and scope of the present invention.

The present invention thus presents a system and method for providing EMR protection to a heat generating electronic device while promoting cooling airflow. In one embodiment, the system utilizes an electromagnetic radiation (EMR) shield that includes: a base plate; and plurality of columns that project away from the base plate, wherein each of the columns has a first end that is attached to the base plate, a second end that is distal to the base plate, and a side surface that has at least one side hole therein. The EMR shield may be made of a material that waveguides electromagnetic radiation, wherein the electromagnetic radiation is conducted by the electromagnetic shield to minimize a passage of the electromagnetic radiation past the electromagnetic shield. In one embodiment, the first end of at least one of the columns has a base plate hole that projects through the base plate to promote air passage through the base plate, and the base plate hole is larger than the side hole. The first end of at least one of the columns may be solid, thus providing additional electromagnetic shielding by the base plate. In another embodiment, the EMR shield also includes a plurality of base plate holes in the base plate, wherein each of the base plate holes is oriented between at least two first ends of two columns that project away from the base plate. The columns may project away perpendicularly from the base plate, and the second end of at least one of the columns may either have a hole to promote air passage through the base plate, or else the second end of at least one of the columns may be solid, thus providing additional electromagnetic shielding. Preferably, each of the columns has a square transverse cross-section, which optimizes the blockage of EMR. Likewise, to block EMR while still affording optimal airflow, the optimal size of the side holes is between 3.3 mm and 6.0 mm in diameter.

While the present invention has been particularly shown and described with reference to a preferred embodiment, it will be understood by those skilled in the art that various changes in form and detail may be made therein without departing from the spirit and scope of the invention.

As noted above, although columns 104 have been depicted as having square cross sections, columns 104 may alternatively have other cross sections, including circles (to create a cylindrical shape), triangles (to create a three-sided prism), etc. The cross section of each column 104 may be the same or different than other columns 104 on a same or different EMR shield 100. Likewise, although side holes 118 have been depicted as being circular and or of uniform size, they may alternatively be different sizes (larger or smaller, either uniformly or non-uniformly such that each hole 118 is either the same size or a different size than some or all of the other holes 118). Furthermore, the shape of the size holes 118 may be different shape (uniformly or non-uniformly shaped as squares, ovals, triangles, etc.) In a preferred embodiment, however, the size and shapes of the columns 104 and/or holes 118 are determined by a required attenuation at a selected frequency. These sizes and shapes can either be determined experimentally, or may be approximately calculated using the formula for Shielding Effect, where $SE_{dB}=(20 \log (\text{lambda}/2*L))+(30*t/L)-10 \log n$ (where lambda is the wavelength of the electromagnetic radiation, L is the hole diameter, t is the thickness of the material and n is the number of holes (in the base plate) that face the heat source).

Furthermore, as used in the specification and the appended claims, the term "computer" or "system" or "computer system" or "computing device" includes any data processing system including, but not limited to, personal computers, servers, workstations, network computers, main frame computers, routers, switches, Personal Digital Assistants (PDA's), telephones, and any other system capable of processing, transmitting, receiving, capturing and/or storing data.

What is claimed is:

1. An electromagnetic shield comprising:
   a base plate;
   a plurality of columns that project away from the base plate, wherein each of the columns has a first end that is attached to the base plate, a second end that is distal to the base plate, and a side surface that has at least one side hole therein; and
   a plurality of base plate holes in the base plate, wherein each of the base plate holes is oriented between at least two first ends of two columns that project away from the base plate.

2. The electromagnetic shield of claim 1, wherein the electromagnetic shield is made of a material that waveguides electromagnetic radiation, wherein the electromagnetic radiation is conducted by the electromagnetic shield to minimize a passage of the electromagnetic radiation past the electromagnetic shield.

3. The electromagnetic shield of claim 1, wherein the first end of at least one of the columns has a base plate column hole that projects through the base plate to promote air passage through the base plate.

4. The electromagnetic shield of claim 3, wherein the base plate column hole is larger than the side hole.

5. The electromagnetic shield of claim 1, wherein the second end of at least one of the columns is solid, thus providing additional electromagnetic shielding by the base plate.

6. The electromagnetic shield of claim 1, wherein the columns project perpendicularly away from the base plate.

7. The electromagnetic shield of claim 1, wherein the second end of at least one of the columns has a top hole to promote air passage through the base plate.

8. The electromagnetic shield of claim 1, wherein the second end of at least one of the columns has a solid top, thus providing additional electromagnetic shielding.

9. The electromagnetic shield of claim 1, wherein each of the columns has a square transverse cross-section.

10. The electromagnetic shield of claim 1, wherein each of the side holes is between 3.3 and 6.0 mm in diameter.

11. A system comprising:
    a circuit board; and
    an electromagnetic shield mounted near the circuit board, wherein the electromagnetic shield provides cooling airflow to pass through the electromagnetic shield while minimizing a passage of electromagnetic radiation from at least one component that is mounted on the circuit board, and wherein the electromagnetic shield includes:
    a base plate;
    a plurality of columns that project away from the base plate, wherein each of the columns has a first end that is attached to the base plate, a second end that is distal to the base plate, and a side that has at least one side hole therein, wherein the second end of at least one of the columns has a hole to promote air passage through the base plate.

12. The system of claim 11, wherein the electromagnetic shield is made of a material that waveguides electromagnetic radiation, wherein the electromagnetic radiation is conducted by the electromagnetic shield to minimize a passage of the electromagnetic radiation past the electromagnetic shield.

13. The system of claim 11, wherein the first end of at least one of the columns has a base plate hole that projects through the base plate to promote air passage through the base plate.

14. The system of claim 11, wherein the first end of at least one of the columns is solid, thus providing additional electromagnetic shielding by the base plate.

15. The system of claim 11, further comprising:
    a plurality of base plate holes oriented between at least two first ends of two columns that project away from the base plate.

16. The system of claim 11, wherein the columns project away perpendicularly from the base plate.

17. The system of claim 11, wherein the second end of at least one of the columns is solid, thus providing additional electromagnetic shielding.

18. The system of claim 11, wherein each of the columns has a square transverse cross-section.

* * * * *